United States Patent [19]

Bo et al.

[11] 4,372,781

[45] Feb. 8, 1983

[54] METHOD AND APPARATUS FOR TREATING EUTECTIC AND EUTECTOID COMPOSITIONS

[76] Inventors: Ermano Bo, Chemin de Monte-Ferrand Ternay, St Symphorien d'Ozon, France, 69360; Tadeusz G. Mathia, Allee des Chenes, Charbonnieres-les-Bains, France, 69620

[21] Appl. No.: 206,951

[22] Filed: Nov. 14, 1980

[30] Foreign Application Priority Data

Feb. 26, 1980 [FR] France ............................... 80 04496

[51] Int. Cl.³ .............................................. C22C 1/02
[52] U.S. Cl. .................................. 75/65 ZM; 75/10 R
[58] Field of Search ...................... 156/620; 422/250; 75/65 ZM, 135, 10 R; 148/32

[56] References Cited

U.S. PATENT DOCUMENTS

| 3,124,452 | 3/1964 | Kraft ..................... 75/65 R |
| 3,564,940 | 2/1971 | Thompson et al. ............ 75/135 |

FOREIGN PATENT DOCUMENTS

| 1806843 | 6/1970 | Fed. Rep. of Germany ........ 75/135 |
| 1945094 | 1/1971 | Fed. Rep. of Germany ........ 75/135 |
| 2130081 | 11/1972 | France ................................ 75/135 |
| 2282667 | 8/1974 | France ................................ 75/135 |

*Primary Examiner*—M. J. Andrews
*Attorney, Agent, or Firm*—Sandler & Greenblum

[57] ABSTRACT

A process and apparatus for preparing anisotropic metallic and ceramic compositions or material includes floating zone melting of eutectics and orientation of eutectoids, as well as melting, frittering, or homogenization of the eutectoids prior to orientation. The process includes solidification of a eutectic in the presence of a thermal gradient while displacing the solidification front of the eutectic along the direction of the gradient and orienting the solid eutectoid which results by imposing a direction of growth on it by displacement of the composition itself or the temperature gradient. The eutectoids are then prepared in a reactive atmosphere within a container and the surface thereof treated in gaseous atmosphere, after which the materials are compacted by displacing them again. The apparatus for performing the process includes a double heating and cooling system and structure for translating and rotating these systems. It additionally includes a support plate for supporting the elements being oriented, the plate being attached to a displacement shaft. Electronic controls for all of the structures are connected to temperature and displacement sensors.

20 Claims, 3 Drawing Figures

METHOD AND APPARATUS FOR TREATING EUTECTIC AND EUTECTOID COMPOSITIONS

BACKGROUND OF THE INVENTION

1. Field of the Invention

The present invention generally relates to a method and apparatus for preparing and treating a variety of anisotropic metallic and ceramic compositions and more particularly, to a process and apparatus for preparing, treating, and orienting eutectic and eutectoid compositions.

2. Description of the Prior Art

Among the various anisotropic composition materials, oriented eutectoid alloys and the oriented solidification of eutectic alloys have been the subject of numerous experimental and technical studies. Such studies have demonstrated that the direction of growth which leads to a fibrous or lamellar alloy structure is caused both by the translation of a furnace and by a temperature gradient. In both cases, after preparation under a vacuum in an induction furnace, the alloys are oriented in a vertically mobile resistance furnace; this permits the alloys to achieve a unidirectional orientation.

SUMMARY OF THE INVENTION

Accordingly, it is a general object of the present invention to provide a new and improved process and apparatus for preparing, treating and orienting a variety of metallic and ceramic compositions, particularly eutectic and eutectoid alloys.

It is an additional object of the present invention to provide a new and improved process and apparatus which makes it possible to both melt a eutectic in a floating zone, homogenize eutectoids before orientation and orient the eutectoids thereafter.

In accordance with the present invention, solidification of eutectics occurs in the presence of a strong thermal (temperature) gradient while a predetermined displacement speed is simultaneously imposed upon the solidification front of the eutectic in the direction of the gradient. Such displacement is caused by the translation and/or the rotation of the eutectics and/or displacement of the temperature gradient. The solid (eutectoid) which is obtained by such movement has a fibrous or lamelar structure which is oriented along the direction of growth imposed upon the eutectoid.

Orientation of the fibers in eutectoids is also carried out along the direction of growth and/or of precipitation caused by the translation and/or rotation of the eutectoids and/or the displacement of the temperature gradient.

In accordance with the process of the present invention, elevated speeds of translation and/or rotation are utilized during the frittering or melting operation to improve the compactness of the composition, i.e., increase its density, and to therefore reduce the residual porosity of the composition which results. Slower speeds of translation and/or rotation are utilized during homogenization as well as during orientation of the fibers or lamellae.

In order to perform this process, an apparatus is utilized which includes heating means, cooling means, means for preventing oxidation and/or a vacuum pumping circuit which includes a device for producing a controlled atmosphere, translation means and/or rotation means for the materials being oriented, as well as the heating and cooling means and control means, and regulation means which are adapted to relay information to electronically programmed control means.

Briefly, the above and other objects, features and advantages of the present invention are provided for in a first aspect thereof by a process for preparing anisotropic metallic and ceramic compositions. The process includes melting a eutectic composition in a floating zone so as to homogenize the eutectic, form a eutectoid and orient such eutectoid. The process includes solidifying a eutectic by providing a thermal gradient while simultaneously displacing to the solidification front of the eutectic along the direction of the gradient. Such displacement is caused by a movement of either the eutectic or the temperature gradient so that the solid obtained will have a fibrous or lamellar structure oriented along the direction of growth imposed. The solid eutectoids obtained are then oriented by imposing a direction of growth on them by either moving the eutectoid or displacing the temperature gradient. Thereafter the surface of the eutectoid composition is treated in a gaseous atmosphere within a container after it has been prepared by placement into a reactive atmosphere within the container. The composition is compacted by movement of the eutectoid itself.

Briefly, the present invention is provided for in a second aspect thereof by apparatus for preparing anisotropic metallic and ceramic materials. The apparatus is adapted to perform floating zone melting of eutectics and orientation of eutectoids as well as to melt, fritter or homogenize the eutectoid prior to orientation thereof. The apparatus comprises a sealed refractory oven, a double heating system, a double cooling system positioned beneath the double heating system, a support plate which is adapted to support the materials to be treated and which is displaceable within the heating and cooling systems. The double heating and cooling systems and the support plate are adapted to be moved by a central electronic control.

BRIEF DESCRIPTION OF THE DRAWINGS

The present invention will now be described with reference to the annexed drawings, illustrating one embodiment of the apparatus of the present invention which may be used to perform the process of the present invention for preparing eutectic and eutectoid compositions and in which.

DETAILED DESCRIPTION OF THE DRAWINGS

Figure 1:
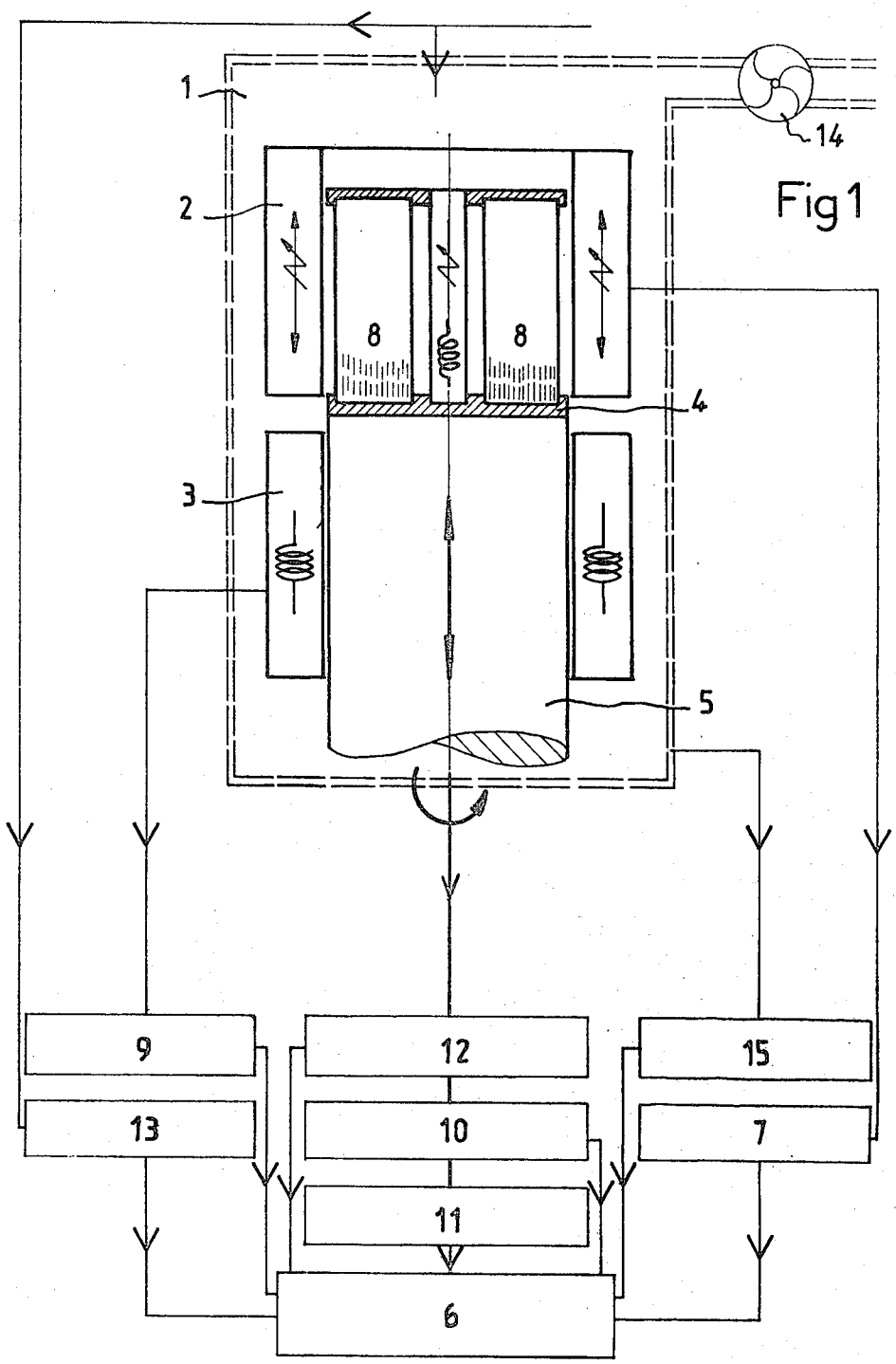
FIG. 1 schematically illustrates an installation formed in accordance with the present invention which is appropriate for the treatment of eutectic and eutectoid compositions.

More specifically referring to FIG. 1, an installation is illustrated which comprises a sealed refractory container 1, a double heating system 2, a double cooling system 3 and a support plate 4 which is adapted to support the elements to be treated and which is attached to the end of a displacement shaft 5. Each of systems 2 and 3 and support plate 4 are adapted to be moved three-dimensionally, movement of each system and plate being controlled by a central electronic control 6.

Double heating system 2 comprises an induction heater utilizing high frequency current which is fed by a variable frequency generator (not shown). Such a heating system can be employed when working with low conductivity materials. The other heating system comprises a resistance heater which is utilized in the case of highly conductive materials because it prevents curved solid-liquid interfaces from occurring. These two heating systems can be utilized in alternating fashion during different phases of operation, e.g., frittering, homogenization, and melting.

Each heating element or system has its own regulator 7 which is controlled by temperature sensors positioned adjacent to the elements (compositions) 8 which are being treated. These sensors feed central electronic control 6 with temperature information.

Double cooling system 3 comprises a serpentine (coil) or other device which permits the transportation and circulation of a cooling fluid. This double system comprises a primary cryogenic circuit and a secondary forced cooling fluid circulation circuit which are regulated by element 9, both with respect to their flow rate and their translational and/or rotational movements. These movements can be performed three-dimensionally in space. All of these movements can be regulated or controlled by the same central electronic control 6 which controls the double heating system.

Container 1 is adapted and configured to permit the translation and/or rotation of heating systems 2, cooling systems 3 and support plate 4, which is adapted to support the elements to be treated. Support plate 4 comprises a device which permits displacement of itself and of the elements which it supports in three dimensions, utilizing translational and/or rotational speeds which are appropriate and which are provided by continuous current or other types of conventional motors (not shown); the motors are regulated by displacement sensors 10 and 11 and controlled by central electronic control means 6. The displacement system associated with support plate 4 can be independent of the orientation (displacement) system for the heating and cooling systems, or it can be the same system if desired.

A viscous friction couple detector 12 is connected to central control means 6 and regulates, in situ, the progression of the oriented zones of elements 8 which are supported by plate 4.

Container 1 comprises an anti-rust or anti-oxidation and anti-corrosion system. The container is maintained under a purified argon atmosphere or an atmosphere of inert gas; such an atmosphere prevents all parasitic oxidation of the materials being treated. Gas feed system 13 similarly permits utilization of container 1 for conducting gaseous phase thermotreatment.

Pumping device 14 allows creation of a vacuum of approximately 10.4 or 10.6 torrs or less during eutectic melting and/or frittering of the powders used for forming eutectoids and/or during the treatment of the compositions, dependent upon the circumstances. Adjustment of the vacuum created is controlled by vacuum control 15, as illustrated in FIG. 1.

Central control means 6 controls all of the treatment phases of the composite materials described hereinabove.

Figure 2:
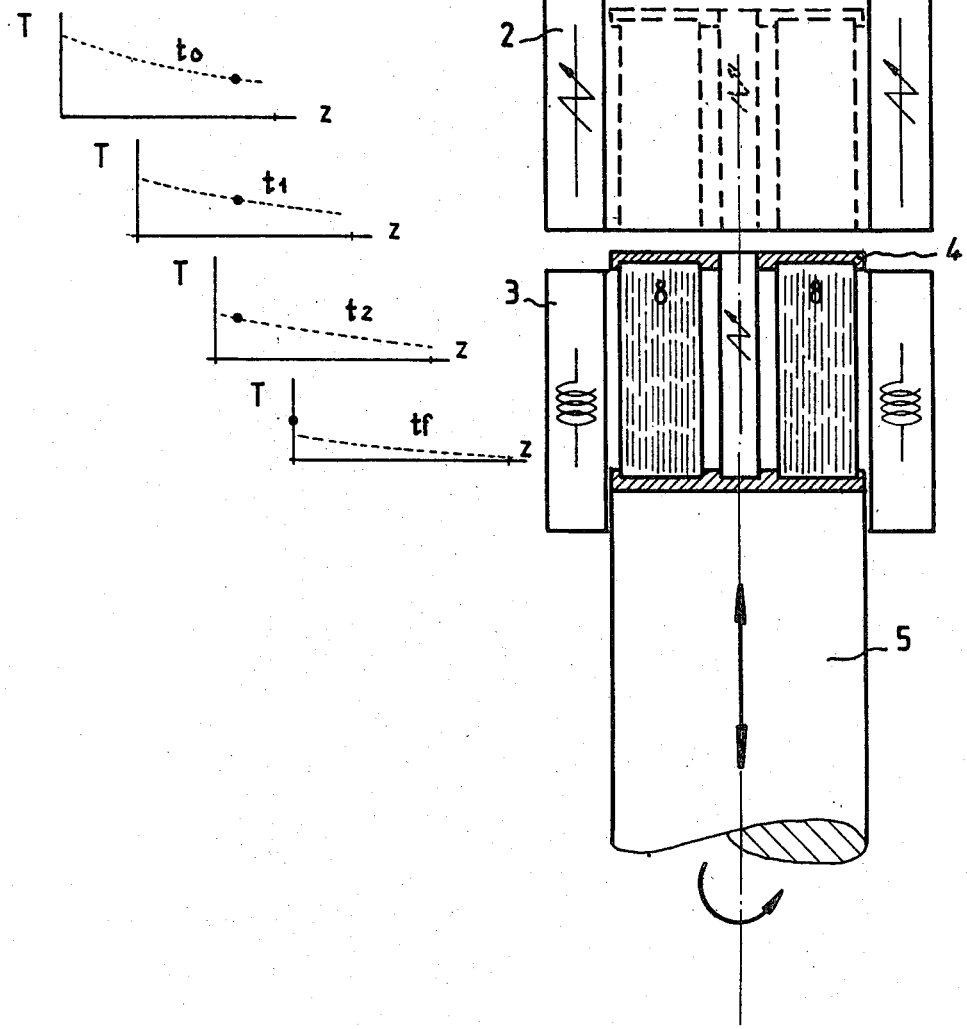
FIG. 2 schematically illustrates the installation of FIG. 1 during the orientation phase and is accompanied by graphs illustrating the axial orientation of fibers during this phase.
Figure 3:
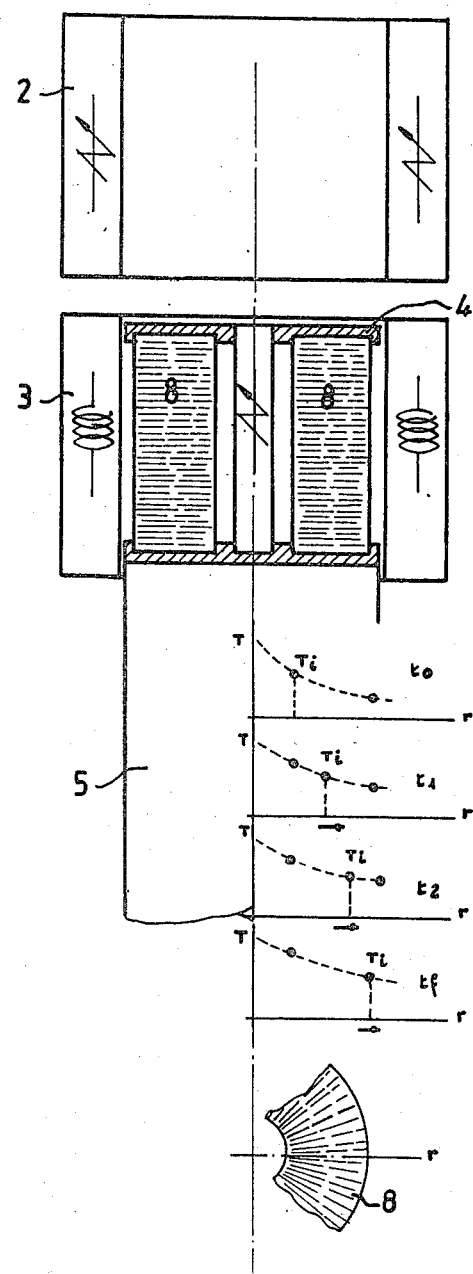
FIG. 3 schematically illustrates the installation of the present invention during the radial orientation phase of the fibrous or lamellar structure of the alloys or elements and is accompanied by graphs demonstrating the process of radial orientation of the fibers.

The graphs which accompany FIGS. 2 and 3 illustrate the formation and orientation processes of the fibers along the interior of elements (eutectic or eutectoid alloys) 8 at different points in time and/or position, i.e., at t0, t1, t2, tf, in a system of coordinates Tz, as illustrated in FIG. 2, or Tr, as illustrated in FIG. 3.

Each of the graphs in FIG. 2 illustrates, in descending order, the advancement of the solidification front of alloys or elements 8 as they are being oriented longditudinally. In these graphs, T represents temperature and z the length along each element 8. The curves in these graphs represent the temperature at all positions along the elements at a predetermined point in time.

In FIG. 3 the axes of the graphs represent temperature (T) and the radius of each element 8 (r). In descending order, the graphs illustrate movement of the solidification front (ti) as it finally reaches the outermost portion of the radius (r) of each element 8. The curves represent the temperature of all points along each element as it is being radially oriented at any given point in time.

The treatment in accordance with the present invention can be performed on all types of elements, without limitation as to their shape or configuration. Accordingly, cylindrical, conical, parallelpipedic, spherical, semispherical and all other shapes can be treated. The elements can be hollow or solid and a plurality of structural configurations can be treated.

The present process makes it possible both to orient the lamellae and/or the fibers in an axial, radial, or curved manner, and similarly makes it possible to modify fiber orientation of eutectoid alloys during the preparation phase. Additionally, the alloys can be prepared, e.g., by frittering or melting, as well as homogenized and treated, in the same installation. The process is further advantageous in that it permits the treatment of elements having large dimensions and, in certain cases, continuous flow treatment. As a result, eutectic alloys are converted into solid eutectoid alloys which are prepared, treated and compacted.

The process is applicable to a plurality of techniques, of which the following are given by way of example only:

(a) the formation of elements having tribologic applications, i.e., in all types of friction elements, such as bearings, swivel joints and machine tools;

(b) utilization for rheological purposes, i.e., in treatments effecting the plasticity, viscosity, and elasticity of elements;

(c) decorative applications, i.e., in the provision of particular effects such as fibrous and lamelle;

(d) in electric applications, i.e., in all elements relating to the carrying of electric current;

(e) in magnetic applications, i.e., in all elements which relate to the conduction of a magnetic field;

(f) in optical and acoustical applications, i.e., in all elements relating to the transmission of light and sound;

(g) in chemical and nuclear industries, particularly in the manufacture of valves; and (h) in aerospace and automotive applications, e.g., in the manufacture of turbine blades, reactors, electrical connectors and wave guides.

It is obvious that the process and apparatus of the present invention are not limited to any particular application nor to the manufacture of any particular element therein. They are instead applicable to the manufacture of a wide variety of elements. Additionally, although the invention has been described with respect to specific means, apparatus and techniques, it is understood that the invention is not limited to the particulars which are disclosed but instead extends to all equivalents falling within the scope of the specification, claims, and drawings.

What is claimed is:

1. A process for the preparation of anisotropic metallic compositions which is adapted to achieve floating zone melting of eutectics and orientation of eutectoids as well as melting, frittering, or homogenization of a composition prior to orientation, said process comprising:
   (a) solidifying a eutectic by providing a temperature gradient and simultaneously displacing the solidification front of said eutectic along the direction of said gradient, so that a solid eutectic is obtained having a fibrous or lamellar structure oriented along a predetermined growth direction;
   (b) imposing a direction of growth on said eutectic so as to orient said eutectic;
   (c) preparing said eutectic by placing it within a container and treating the surface of said eutectic in a gaseous atmosphere within said container; and
   (d) compacting said eutectic by moving said eutectic.

2. A process in accordance with claim 1 wherein said solidification front is displaced by translating said eutectic.

3. A process in accordance with claim 1 wherein said solidification front is rotated.

4. A process in accordance with claim 1 wherein said solidification front is displaced by movement of said temperature gradient.

5. A process in accordance with claim 1 wherein a direction of growth is imposed upon said eutectic by translating said eutectoid.

6. A process in accordance with claim 1 wherein a direction of growth is imposed upon said eutectic by rotating said eutectic.

7. A process in accordance with claim 1 wherein said direction of growth is imposed upon said eutectoid by displacing said temperature gradient.

8. A process in accordance with claim 1 wherein said eutectoid is prepared and treated at the same time.

9. A process in accordance with claim 1 wherein said eutectoid is prepared and treated at different times.

10. A process in accordance with claim 1 wherein said eutectoid is translated.

11. A process in accordance with claim 1 wherein said composition is compacted by rotating said eutectoid.

12. A process in accordance with claim 1 wherein said material is compacted by displacing said eutectoid at elevated velocities during frittering, thereby compacting said eutectoid and reducing its residual porosity.

13. A process in accordance with claim 12 wherein said eutectoid is translated.

14. A process in accordance with claim 12 wherein said eutectoid is rotated.

15. A process in accordance with claim 1 further comprising displacing said eutectoid at a relatively low speed, thereby homogenizing said eutectoid and orienting the fibers or lamellae of said eutectoid.

16. A process in accordance with claim 15 wherein said eutectoid is translated.

17. A process in accordance with claim 15 wherein said eutectoid is rotated.

18. A process in accordance with claim 1 wherein said gaseous atmosphere comprises an inert gas.

19. A process in accordance with claim 1 wherein said gaseous atmosphere comprises purified argon.

20. A process for preparing anisotropic metallic compositions which is adapted to achieve floating zone melting of eutectics and orientation of eutectoids as well as melting, frittering or homogenization of said compositions prior to orientation, said process comprising:
   (a) solidifying a eutectic by providing a temperature gradient and simultaneously displacing the solidification front of said eutectic along the direction of said gradient, so that a eutectic is obtained which has a fibrous or lamellar structure orientable along a plurality of predetermined directions of growth;
   (b) imposing one of said directions of growth on said eutectic so as to orient said eutectic;
   (c) preparing said eutectic by placing it within a container and treating the surface of said eutectic in a gaseous atmosphere within said container; and
   (d) impacting said eutectic by moving said eutectic.

* * * * *

UNITED STATES PATENT AND TRADEMARK OFFICE
CERTIFICATE OF CORRECTION

PATENT NO. : 4,372,781
DATED : February 8, 1983
INVENTOR(S) : Ermanno BO et al.

It is certified that error appears in the above-identified patent and that said Letters Patent is hereby corrected as shown below:

At column 5, line 37, change "eutectoid" to ---eutectic---.

Signed and Sealed this

Thirty-first Day of May 1983

[SEAL]

Attest:

DONALD J. QUIGG

Attesting Officer          Acting Commissioner of Patents and Trademarks